(12) United States Patent
Park

(10) Patent No.: US 7,180,807 B2
(45) Date of Patent: Feb. 20, 2007

(54) SEMICONDUCTOR MEMORY DEVICE HAVING A DELAY CIRCUIT

(75) Inventor: Mun Park, Kyeongki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 38 days.

(21) Appl. No.: 10/907,905

(22) Filed: Apr. 20, 2005

(65) Prior Publication Data

US 2005/0232049 A1 Oct. 20, 2005

(30) Foreign Application Priority Data

Apr. 20, 2004 (KR) .................... 10-2004-0027093

(51) Int. Cl.
*G11C 7/00* (2006.01)
(52) U.S. Cl. .................... 365/222; 365/194; 365/203
(58) Field of Classification Search ................ 365/222, 365/194, 203, 206, 193
See application file for complete search history.

(56) References Cited

U.S. PATENT DOCUMENTS

| | | |
|---|---|---|
| 5,157,630 A | 10/1992 | Suwa et al. |
| 5,530,944 A | 6/1996 | Stones |
| 6,108,252 A | 8/2000 | Park |
| 6,426,908 B1 * | 7/2002 | Hidaka ................ 365/222 |
| 2006/0233033 A1 * | 10/2006 | Park .................... 365/203 |

FOREIGN PATENT DOCUMENTS

| | | |
|---|---|---|
| JP | 3137886 | 6/1991 |
| JP | 2001-035150 | 2/2001 |
| JP | 2003-168292 | 6/2003 |
| JP | 2003-297082 | 10/2003 |

\* cited by examiner

*Primary Examiner*—Tuan T. Nguyen
*Assistant Examiner*—Allison Bernstein
(74) *Attorney, Agent, or Firm*—Marshall, Gerstein & Borun LLP

(57) ABSTRACT

A semiconductor memory device having a delay circuit, the delay circuit is constructed in order for a refresh operation and a normal operation to have different delay paths such that a minimum tRAS (Active to Precharge command period) delay time of the refresh operation to which tRFC (Auto Referesh to Active/Auto Referesh command period) is applied is longer than a minimum tRAS delay time of a normal operation to which tRC (Active to Active/Auto Refresh command period) is applied. Thus, a greater noise margin is secured in tRFC in a refresh operation being the worst situation of a DRAM. Accordingly, the probability that fail can occur is reduced and the yield upon test is thus improved.

5 Claims, 3 Drawing Sheets

SEMICONDUCTOR MEMORY DEVICE HAVING A DELAY CIRCUIT

CROSS REFERENCE TO RELATED APPLICATIONS

This application relies for priority upon Korean Patent Application No. 2004-0027093 filed Apr. 20, 2004, the contents of which are herein incorporated by reference in their entirety.

FIELD OF THE INVENTION

The present invention relates to a semiconductor memory device. More specifically, the present invention relates to a control circuit of a semiconductor memory device, wherein a greater noise margin is secured in tRFC in a refresh operation being the worst situation of a DRAM in such a manner that a delay circuit is constructed in order for a refresh operation and a normal operation to have different delay paths such that a minimum tRAS (Active to Precharge command period) delay time of the refresh operation to which tRFC (Auto Referesh to Active/Auto Referesh command period) is applied is longer than a minimum tRAS delay time of a normal operation to which tRC (Active to Active/Auto Refresh command period) is applied, whereby the probability that fail can occur is reduced and the yield upon test is thus improved.

DISCUSSION OF RELATED ART

A precharge operation of a DRAM can include a case where after an active command is issued from an external chipset (application of a row address and a corresponding word line enable signal), a precharge operation command (application of a bit line precharge signal after disabling a word line) is applied, and a case where after an active operation command is issued, a precharge operation is automatically performed according to a DRAM internal signal after a predetermined time elapses through a delay stage within a DRAM. The latter is called auto-precharge. Generally, the auto-precharge operation includes write with auto-precharge and read with auto-precharge both of which are normal operations, and auto-refresh and self-refresh both of which are refresh operations.

In the normal operation to which tRC (Active to Active/Auto Refresh command period) is applied, if an auto-precharge operation command is applied, precharge is automatically performed after a delay time by a minimum tRAS (hereinafter, referred to as "tRAS_min") delay circuit without a precharge operation command of an external chipset. In the same manner, even in the refresh operation to which tRFC (Auto Referesh to Active/Auto Referesh command period) is applied, precharge is automatically performed after a delay time by the same tRAS_min delay circuit. In the case of a DDR DRAM, however, a setting time of tRC and tRFC is different unlike a SDR DRAM. The refresh operation to which tRFC is applied is an all bank active operation, and the normal operation to which tRC is applied is a 1 bank active operation. Thus, since the refresh operation to which tRFC is applied is the worst condition of the DRAM, more timing margin is given to tRFC rather than tRC because of noise margin, etc. For example, tRC can be 65 ns and tRFC can be 75 ns. However, tRC or tRFC can be expressed into tRAS_min+tRP (Precharge command period). At this time, since tRC and tRFC use the same tRAS_min delay circuit, it is difficult to flexibly use the timing margin of tRFC. That is, there occurs a case where only a timing margin of tRP is added after the same tRAS_min. Accordingly, the yield can be lowered due to power noise at the time of tRFC (auto refresh (IDD5) being the worst situation when a DRAM operates) upon test of a DRAM.

SUMMARY OF THE INVENTION

Accordingly, the present invention has been made in view of the above problems, and it is an object of the present invention to provide a control circuit of a semiconductor memory device, wherein a greater noise margin is secured in tRFC in a refresh operation, thus reducing the probability that fail can occur and improving the yield of products upon test.

Another object of the present invention is to provide a semiconductor memory device, wherein a tRAS_min delay circuit is constructed by separating a tRAS_min delay path of a normal operation to which tRC is applied and a tRAS_min delay path of a refresh operation to which tRFC is applied, thereby securing a greater noise margin in tRFC.

Still another object of the present invention is to provide a control circuit of a semiconductor memory device, wherein a tRAS_min delay path of a refresh operation to which tRFC is applied is set to be longer than a tRAS_min delay path of a normal operation to which tRC is applied, thus reducing fail and improving the yield of products upon test.

To achieve the above objects, according to the present invention, there is provided a control circuit of a semiconductor memory device, comprising a central control circuit for generating an active signal for executing an operation command received from an external chipset, and generating a precharge signal and a refresh signal after a predetermined time, a row path control circuit for controlling a bank according to the active signal or the precharge signal of the central control circuit and outputting a control signal, and a delay circuit for setting a delay path depending upon a normal operation or a refresh operation of the control signal to be different according to the refresh signal, and outputting a delay signal having a different delay time, thus controlling generation of the precharge signal of the central control circuit.

The delay circuit comprises a first delay unit for delaying the control signal for a predetermined time, a switching unit for transferring the signal delayed through the first delay unit according to the refresh signal, a second delay unit for controlling the delay time depending upon the refresh operation by using the signal received from the switching unit, a third delay unit for controlling the delay time depending upon the normal operation by using the signal received from the switching unit, and a logic unit for logically combining the control signal and the output signal of the second or third delay unit.

The switching unit comprises a first transfer gate for transferring the signal delayed through the first delay unit according to the refresh signal and an inverted signal of the refresh signal, a second transfer gate, which operates in a complementary way together with the first transfer gate according to the refresh signal and an inverted signal of the refresh signal, and transfers the signal delayed through the first delay unit, a third transfer gate for transferring the signal delayed through the second delay unit according to the refresh signal and an inverted signal of the refresh signal, and a fourth transfer gate, which operates in a complementary way together with the third transfer gate according to the refresh signal and an inverted signal of the refresh signal, and transfers the signal delayed through the third delay unit.

The delay time of the second delay unit is set to be longer than the delay time of the third delay unit.

The logic unit comprises a NAND gate.

DETAILED DESCRIPTION OF THE PREFERRED EMBODIMENTS

Now, the preferred embodiments according to the present invention will be described with reference to the accompanying drawings.

Figure 1:
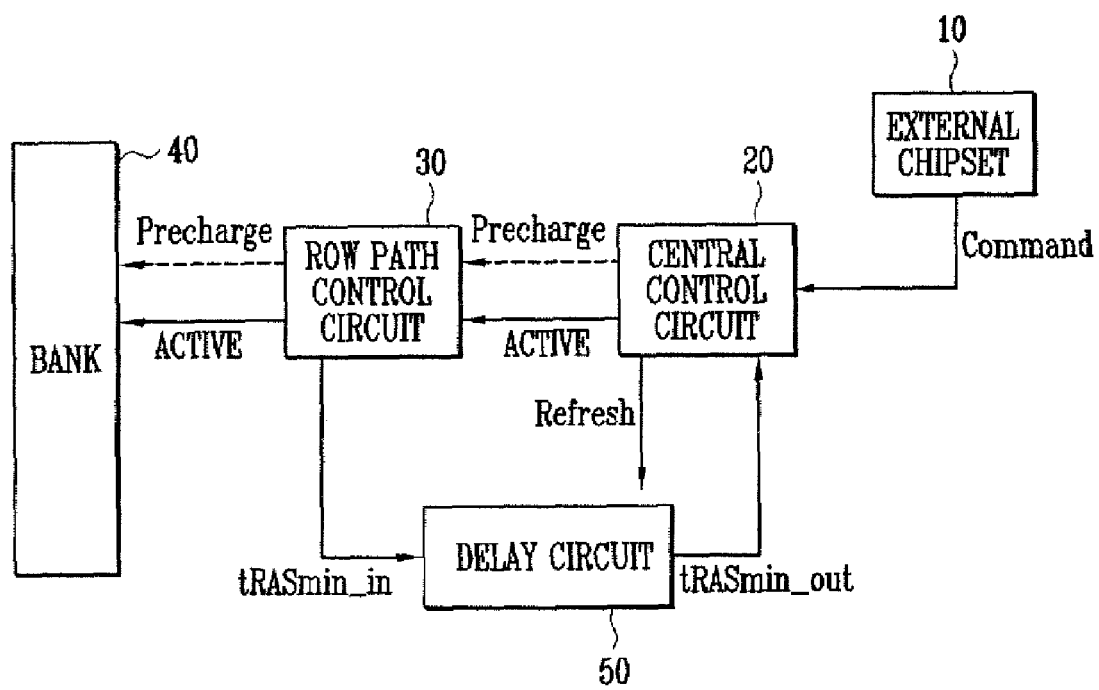
FIG. 1 is a block diagram illustrating the construction of a control circuit of a semiconductor memory device according to the present invention.

FIG. 1 is a block diagram illustrating the construction of a control circuit of a semiconductor memory device according to the present invention.

If a command such as write with auto-precharge, read with auto-precharge or auto-refresh is applied from an external chipset 10, a central control circuit 20 of a DRAM applies an active signal ACTIVE for executing this command to a row path control circuit 30. The row path control circuit 30 inputs a control signal tRASmin_in to a delay circuit 50 while applying the active signal ACTIVE to a bank 40. The delay circuit 50 having a delay time, which has been suitably tuned to tRAS_min, delays the control signal tRASmin_in for a predetermined time and outputs a delay signal tRASmin_out to the central control circuit 20. The central control circuit 20 generates a precharge signal Precharge and inputs it to the row path control circuit 30. The row path control circuit 30 precharges the bank 40. Meanwhile, a refresh operation is the same as a precharge operation, but is different from the precharge operation in that the central control circuit 20 inputs a refresh signal Refresh to the delay circuit 50, thus changing the delay path. However, the delay circuit 50 allows a delay path in a normal operation to which tRC is applied and a delay path in a refresh operation to which tRFC is applied to have a different delay time by setting them to be different. Meanwhile, the delay path in the refresh operation to which tRFC is applied is set to be longer than the delay path in the normal operation to which tRC is applied.

Figure 2:
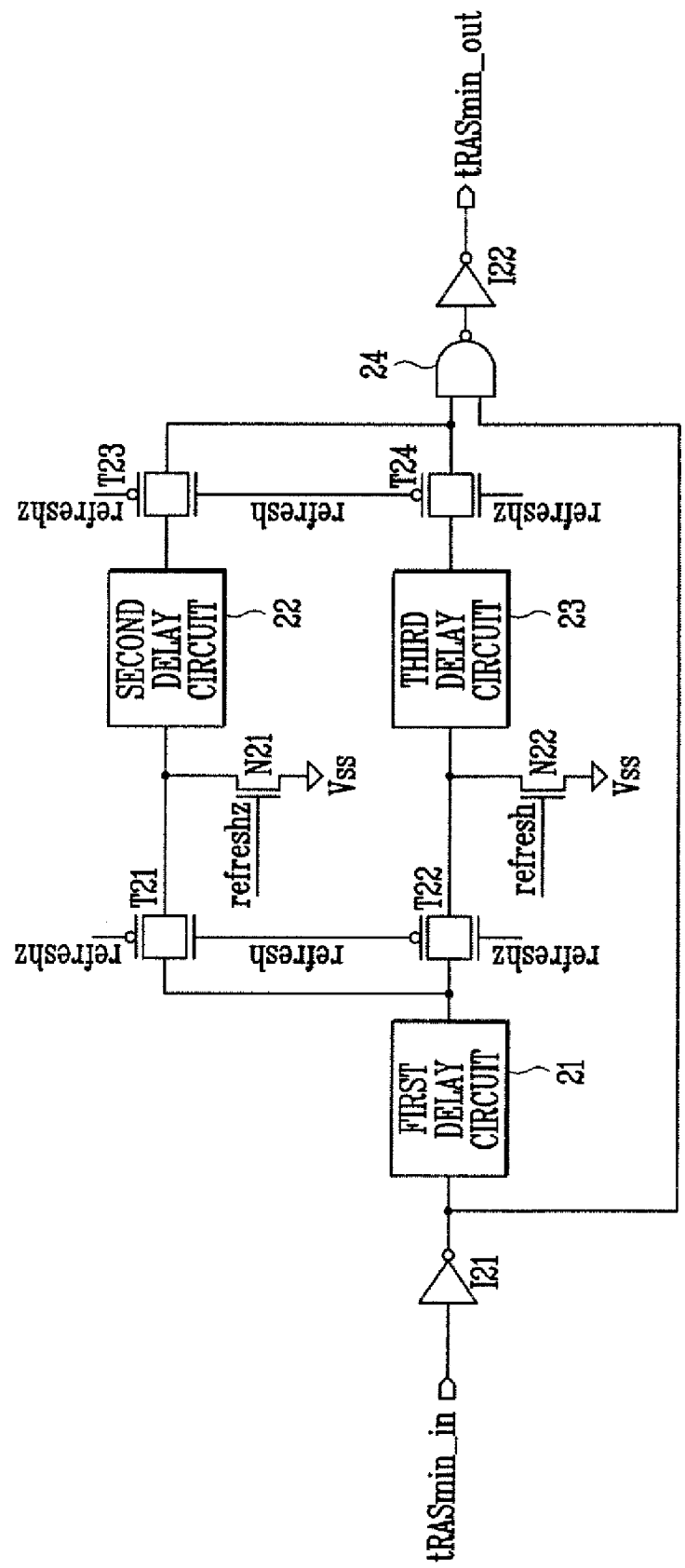
FIG. 2 is a detailed circuit diagram of a delay circuit that is applied to the control circuit of the semiconductor memory device according to the present invention.

FIG. 2 is a detailed circuit diagram of a delay circuit that is applied to the control circuit of the semiconductor memory device according to the present invention.

A first delay unit 21 commonly delays a setting time, e.g., tRAS_min depending upon the normal operation to which tRC is applied and tRAS_min depending upon the refresh operation to which tRFC is applied, by using a signal, which is inverted from the control signal tRASmin_in from the row path control circuit through a first inverter 121. The signal delayed by the first delay unit 21 is transferred to different paths through first and second transfer gates T21 and T22. The first transfer gate T21 is driven according to a refresh signal refresh and a refresh bar signal refreshz, which is an inverted signal of the refresh signal, and the second transfer gate T22 is driven according to the refresh signal refresh and the refresh bar signal refreshz in a complementary manner together with the first transfer gate T22. Meanwhile, a first NMOS transistor N21 driven according to the refresh bar signal refreshz is connected between an output terminal of the first transfer gate T21 and a ground terminal Vss. A second NMOS transistor N22 driven according to the refresh signal refresh is connected between an output terminal of the second transfer gate T22 and a ground terminal Vss.

A second delay unit 22 controls a delay time for tRAS_min depending upon the refresh operation to which tRFC is applied by using the signal transferred through the first transfer gate T21. A third delay unit 23 controls a delay time for tRAS_min depending upon the normal operation to which tRC is applied by using the signal transferred through the second transfer gate T22. A third transfer gate T23 is driven according to the refresh signal refresh and the refresh bar signal refreshz to transfer the output signal of the second delay unit 22. A fourth transfer gate T24 is driven according to the refresh signal refresh and the refresh bar signal refreshz in a complementary manner together with the third transfer gate T23, and thus transfers the output signal of the third delay unit 23.

A NAND gate 24 logically combines the signal received from the third or fourth transfer gate T23 or T24 and the output signal of a first inverter 121. The output signal of the NAND gate 24 is inverted by a second inverter 122 and then outputted as the delay signal tRASmin_out.

A method of driving the delay circuit constructed above, which is applied to the control circuit of the semiconductor memory device, according to the present invention will now be described.

The control signal tRASmin_in from the row path control circuit is inverted by the first inverter 121 and then inputted to the first delay unit 21. The first delay unit 21 delays the control signal tRASmin_in for common tRAS_min regardless of the normal operation to which tRC is applied or the refresh operation to which tRFC is applied.

In the normal operation, if the refresh signal refresh is applied as a logic LOW state, the refresh bar signal refreshz being an inverted signal of the refresh signal refresh is applied as a logic HIGH state. Accordingly, the second and fourth transfer gates T22 and T24 are turned on and the first and third transfer gates T21 and T23 are turned off. Further, the first NMOS transistor N21 is turned on and the second NMOS transistor N22 is turned off. The output signal of the first delay unit 21, which is transferred through the second transfer gate T22, is inputted to the third delay unit 23. The third delay unit 23 delays a signal for tRAS_min depending upon the normal operation to which tRC is applied, and outputs the delayed signal. The output signal of the third delay unit 23 is transferred to the NAND gate 24 through the fourth transfer gate T24. The NAND gate 24 logically combines the output signal of the first inverter 121 and the signal, which has been delayed for tRAS_min depending upon the normal operation to which tRC is applied through the first delay unit 21 and the third delay unit 23. The output signal of the NAND gate 24 is inverted by the second inverter 122 and then outputted as the delay signal tRASmin_out.

In the refresh operation, if the refresh signal refresh is applied as a logic HIGH state, the refresh bar signal refreshz being an inverted signal of the refresh signal refresh is applied as a logic LOW state. Accordingly, the first and third transfer gates T21 and T23 are turned on and the second and fourth transfer gates T22 and T24 are turned off. Further, the first NMOS transistor N21 is turned off and the second NMOS transistor N22 is turned on. The output signal of the first delay unit 21, which is transferred through the first transfer gate T21, is inputted to the second delay unit 22. The second delay unit 22 delays a signal for tRAS_min depending upon the refresh operation to which tRFC is applied, and outputs the delayed signal. The output signal of the second delay unit 22 is transferred to the NAND gate 24 through the third transfer gate T23. The NAND gate 24 logically combines the output signal of the first inverter 121 and the signal, which has been delayed for tRAS_min depending upon the refresh operation to which tRFC is applied through the first delay unit 21 and the second delay unit 22. The output signal of the NAND gate 24 is inverted by the second inverter 122 and then outputted as the delay signal tRASmin_out.

Figure 3:
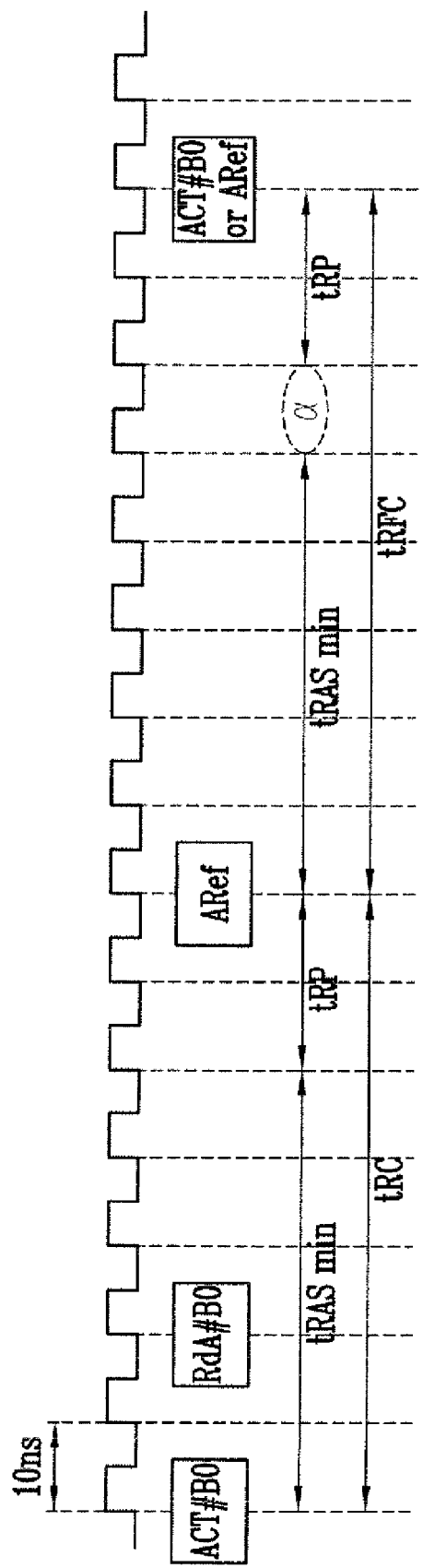
FIG. 3 is a timing diagram of tRC and tRFC in a DRAM operation.

FIG. 3 is a timing diagram of tRC and tRFC in a DRAM operation, which shows a case where the DRAM operates 100 MHz (tCK=10 ns) and tRC=60 ns, tRAS_min=45 ns, tRP=15 ns, tRFC=75 ns. Since tCK is 10 ns, tRAS_min is represented as 5 clocks and tRP is represented as 2 clocks. tRC being 60 ns becomes 7 clocks (70 ns). On the contrary, tRFC has a set value of 75 ns, and is thus represented as 8 clocks. Accordingly, upon auto-precharge, tRC=tRAS_min+tRP and tRFC=tRAS_min+α+tRP. It can be thus seen that there is a margin of tRFC=tRC+α. This means that if the same tRAS_min delay circuit is used, a time of α is consumed upon refresh operation. By separating the tRAS_min delay circuit, the operational characteristics of a DRAM and the yield of products in test can be improved by adding the margin of α to tRAS_min in the refresh operation.

As described above, according to the present invention, a tRAS_min delay circuit is constructed in order for a refresh operation and a normal operation to have different delay paths such that a minimum tRAS (Active to Precharge command period) delay time of the refresh operation to which tRFC (Auto Referesh to Active/Auto Referesh command period) is applied is longer than a minimum tRAS delay time of a normal operation to which tRC (Active to Active/Auto Refresh command period) is applied. Thus, a greater noise margin can be secured in tRFC in the refresh operation being the worst situation of a DRAM. Accordingly, the present invention is advantageous in that it can reduce the probability that fail can occur and can improve the yield upon test.

Although the foregoing description has been made with reference to the preferred embodiments, it is to be understood that changes and modifications of the present invention may be made by the ordinary skilled in the art without departing from the spirit and scope of the present invention and appended claims.

What is claimed as new and desired to be protected by Letters Patent of the United States is:

1. A semiconductor memory device, comprising:
   a central control circuit for generating an active signal for executing an operation command received from an external chipset, and generating a precharge signal and a refresh signal after a predetermined time;
   a row path control circuit for controlling a bank according to the active signal or the precharge signal of the central control circuit and outputting a control signal; and
   a delay circuit for setting a delay path depending upon a normal operation or a refresh operation of the control signal to be different according to the refresh signal, and outputting a delay signal having a different delay time, thus controlling generation of the precharge signal of the central control circuit.

2. The semiconductor memory device as claimed in claim 1, wherein the delay circuit comprises:
   a first delay unit for delaying the control signal for a predetermined time;
   a switching unit for transferring the signal delayed through the first delay unit according to the refresh signal;
   a second delay unit for controlling the delay time depending upon the refresh operation by using the signal received from the switching unit;
   a third delay unit for controlling the delay time depending upon the normal operation by using the signal received from the switching unit; and
   a logic unit for logically combining the control signal and the output signal of the second or third delay unit.

3. The semiconductor memory device as claimed in claim 2, wherein the switching unit comprises:
   a first transfer gate for transferring the signal delayed through the first delay unit according to the refresh signal and an inverted signal of the refresh signal;
   a second transfer gate, which operates in a complementary way together with the first transfer gate according to the refresh signal and an inverted signal of the refresh signal, and transfers the signal delayed through the first delay unit;
   a third transfer gate for transferring the signal delayed through the second delay unit according to the refresh signal and an inverted signal of the refresh signal; and
   a fourth transfer gate, which operates in a complementary way together with the third transfer gate according to the refresh signal and an inverted signal of the refresh signal, and transfers the signal delayed through the third delay unit.

4. The semiconductor memory device as claimed in claim 2, wherein the delay time of the second delay unit is set to be longer than the delay time of the third delay unit.

5. The semiconductor memory device as claimed in claim 2, wherein the logic unit comprises a NAND gate.

* * * * *